(12) United States Patent
Ozaki et al.

(10) Patent No.: US 11,328,948 B2
(45) Date of Patent: *May 10, 2022

(54) ELECTROSTATIC CHUCK DEVICE AND METHOD OF MANUFACTURING ELECTROSTATIC CHUCK DEVICE

(71) Applicant: SUMITOMO OSAKA CEMENT CO., LTD., Tokyo (JP)

(72) Inventors: Masaki Ozaki, Tokyo (JP); Norito Morishita, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 197 days.

This patent is subject to a terminal disclaimer.

(21) Appl. No.: 16/761,891

(22) PCT Filed: Jul. 19, 2019

(86) PCT No.: PCT/JP2019/028388
§ 371 (c)(1),
(2) Date: May 6, 2020

(87) PCT Pub. No.: WO2020/044843
PCT Pub. Date: Mar. 5, 2020

(65) Prior Publication Data
US 2020/0303229 A1    Sep. 24, 2020

(30) Foreign Application Priority Data
Aug. 30, 2018 (JP) .............................. JP2018-161547

(51) Int. Cl.
*H01T 23/00* (2006.01)
*H01L 21/683* (2006.01)
(Continued)

(52) U.S. Cl.
CPC ............ *H01L 21/6833* (2013.01); *B23Q 3/15* (2013.01); *H01L 21/67098* (2013.01);
(Continued)

(58) Field of Classification Search
None
See application file for complete search history.

(56) References Cited

U.S. PATENT DOCUMENTS 9,466,518 B2 * 10/2016 Maeta ................. H01L 21/6831
2006/0011610 A1    1/2006 Kondou et al.
(Continued)

FOREIGN PATENT DOCUMENTS

JP    2008-041927 A    2/2008
JP    2009-111243 A    5/2009
(Continued)

OTHER PUBLICATIONS

International Search Report for PCT/JP2019/028388 (dated Aug. 20, 2019).

*Primary Examiner* — Stephen W Jackson
(74) *Attorney, Agent, or Firm* — Merchant & Gould P.C.

(57) ABSTRACT

An electrostatic chuck device (1) including: an electrostatic chuck part (2) which includes a base material (11) having a mounting surface (11a) on which a plate-like sample W is mounted, and an internal electrostatic attraction electrode (13) which electrostatically attracts the plate-like sample (W) to the mounting surface (11a); a cooling base part (3) which is configured to cool the electrostatic chuck part (2); and an adhesive layer (4) which is interposed therebetween, in which a shape of the mounting surface of the base material (11) includes a concave surface (23) or a convex surface, which is a curved surface that gradually curves from a center (11b) of the mounting surface (11a) toward an outer periphery (11c) of the mounting surface (11a) and includes
(Continued)

no inflection point, and an absolute value of a difference between a height of a center of the concave surface (23) or the convex surface from a position of a main surface (3a) of the cooling base part (3) as a reference and a height of an outer periphery of the concave surface (23) or the convex surface from the position of the main surface (3a) of the cooling base part (3) as a reference is 1 μm or higher and 30 μm or lower.

11 Claims, 4 Drawing Sheets

(51) Int. Cl.
*B23Q 3/15* (2006.01)
*H01L 21/67* (2006.01)
*H01L 21/687* (2006.01)
*H02N 13/00* (2006.01)

(52) U.S. Cl.
CPC .... *H01L 21/6875* (2013.01); *H01L 21/68735* (2013.01); *H02N 13/00* (2013.01)

(56) References Cited

U.S. PATENT DOCUMENTS

2006/0209490 A1* 9/2006 Nakamura .......... H01L 21/6831 361/234
2014/0355169 A1* 12/2014 Maeta ................ H01L 21/6831 361/234

FOREIGN PATENT DOCUMENTS

| | | |
|---|---|---|
| JP | 4739039 B | 8/2011 |
| JP | 4909424 B | 4/2012 |
| JP | 4942364 B2 | 5/2012 |
| JP | 2012-222284 A | 11/2012 |
| JP | 6119430 B2 | 4/2017 |
| JP | 2018-064055 A | 4/2018 |

* cited by examiner

ELECTROSTATIC CHUCK DEVICE AND METHOD OF MANUFACTURING ELECTROSTATIC CHUCK DEVICE

TECHNICAL FIELD

The present invention relates to an electrostatic chuck device and a method of manufacturing the electrostatic chuck device.

This application is a U.S. National Stage Application under 35 U.S.C. § 371 of International Patent Application No. PCT/JP2019/028388, filed on Jul. 19, 2019, which claims priority to Japanese Patent Application No. 2018-161547, filed on Aug. 30, 2018, the disclosures of all of which are hereby incorporated by reference in their entireties.

BACKGROUND

In the related art, in a step of manufacturing a semiconductor device, a liquid crystal device, or the like, various processes are performed on a surface of a plate-like sample such as a semiconductor wafer, a metal wafer, and a glass substrate. In a case of performing various processes, an electrostatic chuck device is used to fix the plate-like sample by electrostatic attraction force and maintain the plate-like sample at a preferable constant temperature.

The electrostatic chuck device is a device having an electrostatic chuck part, in which an internal electrostatic attraction electrode is provided inside or on a lower surface of a ceramic plate-shaped body of a dielectric body, as an essential component. In addition, the electrostatic chuck device places a plate-like sample such as a semiconductor wafer, a metal wafer, and a glass substrate on a surface (attraction surface) of a ceramic plate-shaped body. Furthermore, the plate-like samples are attracted and fixed onto the attraction surface of the ceramic plate-shaped body due to the electrostatic attraction force generated by applying a voltage between the plate-like sample and the internal electrostatic attraction electrode.

In such an electrostatic chuck device, there is an apparatus in which an inert gas such as helium is flowed between an attraction surface of a ceramic plate-shaped body and a plate-like sample to cool the plate-like sample in order to control the temperature of the plate-like sample during processing or treatment. In such an electrostatic chuck device, various improvements have been executed to remedy various characteristics such as a sealing characteristic of an inert gas and a desorption characteristic of a plate-like sample such as a wafer.

For example, proposed is an electrostatic chuck device in which an annular projection portion is provided on a peripheral portion of a main surface of a base material such as a ceramic plate-shaped body, and a plurality of projection portions having the same height as the annular projection portion are provided in a region surrounded by the annular projection portion on the main surface. More specifically, an upper end of the annular projection portion and upper ends of the plurality of projection portions are positioned on a concave surface whose bottom surface is a center portion of the main surface of the base material. Thereby, in a case where the plate-like sample is attracted or desorbed, the plate-like sample is not deformed, the temperature of the plate-like sample also becomes uniform, and particles are hardly generated (for example, see Patent Literature No. 1).

The electrostatic chuck device is manufactured by a method including the following steps. That is, the electrostatic chuck device is manufactured by a manufacturing method including: a step of forming a flat surface by polishing processing on a surface of an electrostatic chuck part having a support plate, and performing blasting processing on the surface; a step of fixing a plurality of prismatic spacers on a bonding surface of a cooling base part (a surface of a base part) with the electrostatic chuck part at equal intervals; and a step of applying an adhesive onto the bonding surface of the cooling base part with the spacer fixed thereto, bringing the support plate of the electrostatic chuck part into close contact with the adhesive, approaching the support plate of the electrostatic chuck part to an upper surface of the spacer, deforming the entire electrostatic chuck part into an arcuate cross-sectional shape by pressing the electrostatic chuck part against the cooling base part, and as a result, positioning an upper end surface of the annular projection portion and an upper end surface of each of the plurality of projection portions of the electrostatic chuck part on a concave surface. The electrostatic chuck device is also manufactured by a method including the following steps. That is, the electrostatic chuck device is manufactured by a manufacturing method including: a step of forming a flat surface by polishing processing on a surface of a mounting plate, and performing blasting processing on the surface; a step of preparing the electrostatic chuck part after bonding and integrating the mounting plate, an internal electrode layer for attraction, and the support plate, and polishing the entire surface of the mounting plate of the electrostatic chuck part to become a concave surface; a step of preparing a cooling base part with a spacer fixed thereto, applying an adhesive onto a bonding surface of the base part, bringing a support plate of the electrostatic chuck part into close contact with the adhesive, approaching the support plate of the electrostatic chuck part to an upper surface of the spacer, deforming the entire electrostatic chuck part into an arcuate cross-sectional shape by pressing the electrostatic chuck part against the cooling base part, and positioning an upper end surface of the annular projection portion and an upper end surface of each of the plurality of projection portions of the electrostatic chuck part on a concave surface.

In addition, there is also known a method of manufacturing a member for a semiconductor manufacturing apparatus capable of providing a member for a semiconductor manufacturing apparatus in which a concave surface shape of a supporting plate is accurately reflected on an electrostatic chuck reproducing a concave surface shape as followed. Specifically, the method includes: (a) a step of providing an electrostatic chuck having a wafer mounting face, a supporting plate having a concave face with the center being lower than a circumference, and a metal bonding material in a form of a flat plate, the electrostatic chuck being made of a ceramic and having a form of a flat plate, the supporting plate including a composite material having a difference in linear thermal expansion coefficient at 40° C. to 570° C. from the ceramic of $0.2 \times 10^{-6}$/K or lower in absolute value; and (b) a step of interposing a metal bonding material between the concave face of the supporting plate and a face of the electrostatic chuck opposite to the wafer mounting face, and thermocompression bonding the supporting plate and the electrostatic chuck at a temperature not more than the solidus temperature of the metal bonding material to deform the electrostatic chuck to the shape of the concave face (for example, see Patent Literature No. 2).

CITATION LIST

Patent Literature

[Patent Literature No. 1] Japanese Patent No. 6119430
[Patent Literature No. 2] Japanese Laid-open Patent Publication No. 2018-64055

SUMMARY OF INVENTION

Technical Problem

In the method of manufacturing an electrostatic chuck described in Patent Literature No. 1, the support plate of the electrostatic chuck part is brought into close contact with the adhesive applied to the bonding surface of the cooling base part. Then, the support plate of the electrostatic chuck part is approached to the upper surface of the spacer, and the electrostatic chuck part is pressed against the cooling base part. As a result, the entire electrostatic chuck part is deformed into the arcuate cross-sectional shape. In addition, in the method of manufacturing an electrostatic chuck disclosed in Patent Literature No. 1, the polishing processing is performed on the entire surface of the mounting plate of the electrostatic chuck part to become the concave surface, and then the adhesive is applied onto the bonding surface of the cooling base part. Thereafter, the support plate of the electrostatic chuck part is brought into close contact with the adhesive and approached to the upper surface of the spacer, and the electrostatic chuck part is pressed against the cooling base part. As a result, the entire electrostatic chuck part is deformed into the arcuate cross-sectional shape. Therefore, although a concave surface is formed on the entire electrostatic chuck part, there is an inflection point, in other words, there is a point where a concave and convex exists on the concave surface. In a case where the inflection point exists on the concave surface, there is a problem that a gap is generated between the plate-like sample and the concave surface when the plate-like sample is attracted, and a temperature of the plate-like sample is difficult to be uniform.

Here, the inflection point can be obtained by measuring a surface profile of the electrostatic chuck part with a three-dimensional measuring machine (trade name: RVA800A, manufactured by TOKYO SEIMITSU CO., LTD.). The measurement points are the center of the mounting surface and a plurality of positions on some concentric circles. Specifically, the measurement is performed on eight points at 45° intervals on a concentric circumference having a radius of 30 mm (eight orientations of 0°, 45°, 90°, 135°, 180°, 225°, 270°, and 315°), eight points at 45° intervals on a concentric circumference having a radius of 60 mm, eight points at 45° intervals on a concentric circumference having a radius of 90 mm, eight points at 45° intervals on a concentric circumference having a radius of 120 mm, and eight points at 45° intervals on a concentric circumference having a radius of 145 mm. Here, a total of 40 points are measured. A difference between heights of two points on adjacent concentric circles in the same orientation among the above eight orientations is calculated. For example, at 0°, a difference between heights of the point of the concentric circle having a radius of 30 mm and the point of the concentric circle having a radius of 60 mm (the height of the point of the concentric circle having a large radius (for example, the height of the point of the concentric circle having a radius of 60 mm)–the height of the point of the concentric circle having a small radius (for example, the height of the point of the concentric circle having a radius of 30 mm)) is calculated. Separately, measurement for a height and calculation for a height difference are performed on a point on a concentric circle outside the adjacent concentric circles and a point on a new concentric circle outside the concentric circle, in the orientation. A point where a sign of the obtained calculation value is inverted as compared with a previous value is defined as an inflection point. In other words, in a case where a plus value and a minus value appear, it can be determined that there is an inflection point.

In the method of manufacturing an electrostatic chuck disclosed in Patent Literature No. 2, a supporting plate formed of a nonmetallic material is used. Therefore, in a case of forming a flow channel of gas or water for adjusting temperature flowing on the supporting plate, there is a problem that the manufacturing cost increases.

The present invention has been made in view of the above circumstances, and is to provide an electrostatic chuck device capable of making a surface temperature of a plate-like sample uniform and a method of manufacturing the same.

Solution to Problem

As a result of intensive studies by the present inventors in order to solve the above described problems, the following was found as one of causes that the surface temperature of the plate-like sample could not be uniform. It is found that in a case where the inflection point exists on the surface of the mounting plate of the electrostatic chuck part, the gap is generated between the plate-like sample and the surface of the mounting plate when the plate-like sample is attracted, and as a result, the temperature of the plate-like sample is difficult to be uniform. Therefore, the inventors have found that the temperature of the plate-like sample can be uniform according to the electrostatic chuck device of the following aspects, and have completed the present invention.

In the present invention, provided is an electrostatic chuck device including: an electrostatic chuck part including a base material having a mounting surface on which a plate-like sample is mounted, and an internal electrostatic attraction electrode that electrostatically attracts the plate-like sample to the mounting surface; a cooling base part for cooling the electrostatic chuck part; and an adhesive layer interposed between the electrostatic chuck part and the cooling base part, in which a cross-sectional shape of the base material in a thickness direction includes a concave surface or a convex surface, the concave surface or the convex surface being formed in a curved shape that gradually curves from a center of the mounting surface toward an outer periphery of the mounting surface and includes no inflection point, and an absolute value of a difference between a height of a center of the concave surface or the convex surface with reference to a main surface of the cooling base part and a height of an outer periphery of the concave surface or the convex surface with reference to a main surface of the cooling base part is 1 μm or higher and 30 μm or lower.

That is, in a first aspect of the present invention, provided is an electrostatic chuck device comprising: an electrostatic chuck part which includes a base material having amounting surface on which a plate-like sample is mounted, and an internal electrostatic attraction electrode which electrostatically attracts the plate-like sample to the mounting surface; a cooling base part which is configured to cool the electrostatic chuck part; and an adhesive layer which is interposed between the electrostatic chuck part and the cooling base part, wherein the mounting surface of the base material has a concave surface or a convex surface, the concave surface or the convex surface is a curved surface which gradually curves from a center of the mounting surface toward an outer periphery of the mounting surface and does not have an inflection point, and the base material has a cross-section in a thickness direction in which an absolute value of a difference between a height of a center of the concave surface or the convex surface and a height of an outer periphery of the concave surface or the convex surface is 1 μm or higher and 30 μm or lower, wherein the height of the center of the concave surface or the convex surface is obtained based on a position where a main surface of the cooling base part is located, and the height of the outer periphery of the concave surface or the convex surface is obtained based on the position where the main surface of the cooling base part is located.

The cross-sectional shape which includes a concave surface or a convex surface may be understood as means that the mounting surface is formed by the concave surface or the convex surface as described above and a gentle curve is formed by projecting downward or projecting upward when the mounting surface is viewed from the cross-section. The curve is preferably bilaterally symmetric, and preferably has no peak except at the center.

Here, the curved shape may be an arc shape, a hyperbolic shape, an elliptical shape, a conical shape, a parabolic shape, a radial shape, or the like and refers to a smooth surface. The curved shape is preferably an arc shape.

In one aspect of the present invention, a surface roughness of the mounting surface may be lower than 40 nm.

In a second aspect of the present invention, provided is a method of manufacturing an electrostatic chuck device including: a bonding step of bonding an electrostatic chuck part including a base material having a mounting surface on which a plate-like sample is mounted and an internal electrostatic attraction electrode that electrostatically attracts the plate-like sample to the mounting surface, to a cooling base part for cooling the electrostatic chuck part through an adhesive; and a processing step of processing the mounting surface on the base material of the electrostatic chuck part bonded to the cooling base part so that a cross-sectional shape of the base material in a thickness direction includes a concave surface or a convex surface, the concave surface or the convex surface being formed in a curved shape that gradually curves from a center of the mounting surface toward an outer periphery of the mounting surface, and includes no inflection point.

That is, provided is a method of manufacturing an electrostatic chuck device comprising: a bonding step of bonding, through an adhesive, an electrostatic chuck part which includes a base material having a mounting surface on which a plate-like sample is mounted and an internal electrostatic attraction electrode which electrostatically attracts the plate-like sample to the mounting surface and a cooling base part which is configured to cool the electrostatic chuck part; and a processing step of processing the mounting surface of the base material of the electrostatic chuck part, which is bonded to the cooling base part, so that a shape of the mounting surface of the base material has a concave surface or a convex surface, which is a curved surface which gradually curves from a center of the mounting surface toward an outer periphery of the mounting surface and does not have an inflection point.

Advantageous Effects of Invention

According to one aspect of the present invention, provided are an electrostatic chuck device capable of making a surface temperature of a plate-like sample uniform and a method of manufacturing the same.

DESCRIPTION OF EMBODIMENTS

Hereinafter, embodiments of an electrostatic chuck device and a method of manufacturing the same according to the present invention will be described with reference to the drawings.

The present embodiments are specifically described for better understanding of the gist of the invention, and the present invention is not limited unless otherwise specified.

In the drawings used in the following description, for the purpose of emphasizing characteristic portions, the characteristic portions may be enlarged for convenience, and dimensional ratios and the like of the respective components are not necessarily the same as the actual ratios. In addition, for the same purpose, non-characteristic parts may be omitted in the drawings. The number, position, size, numerical value, ratio, and the like can be changed, omitted, or added without departing from the scope of the present invention.

(1) First Embodiment

Electrostatic Chuck Device

Figure 1:
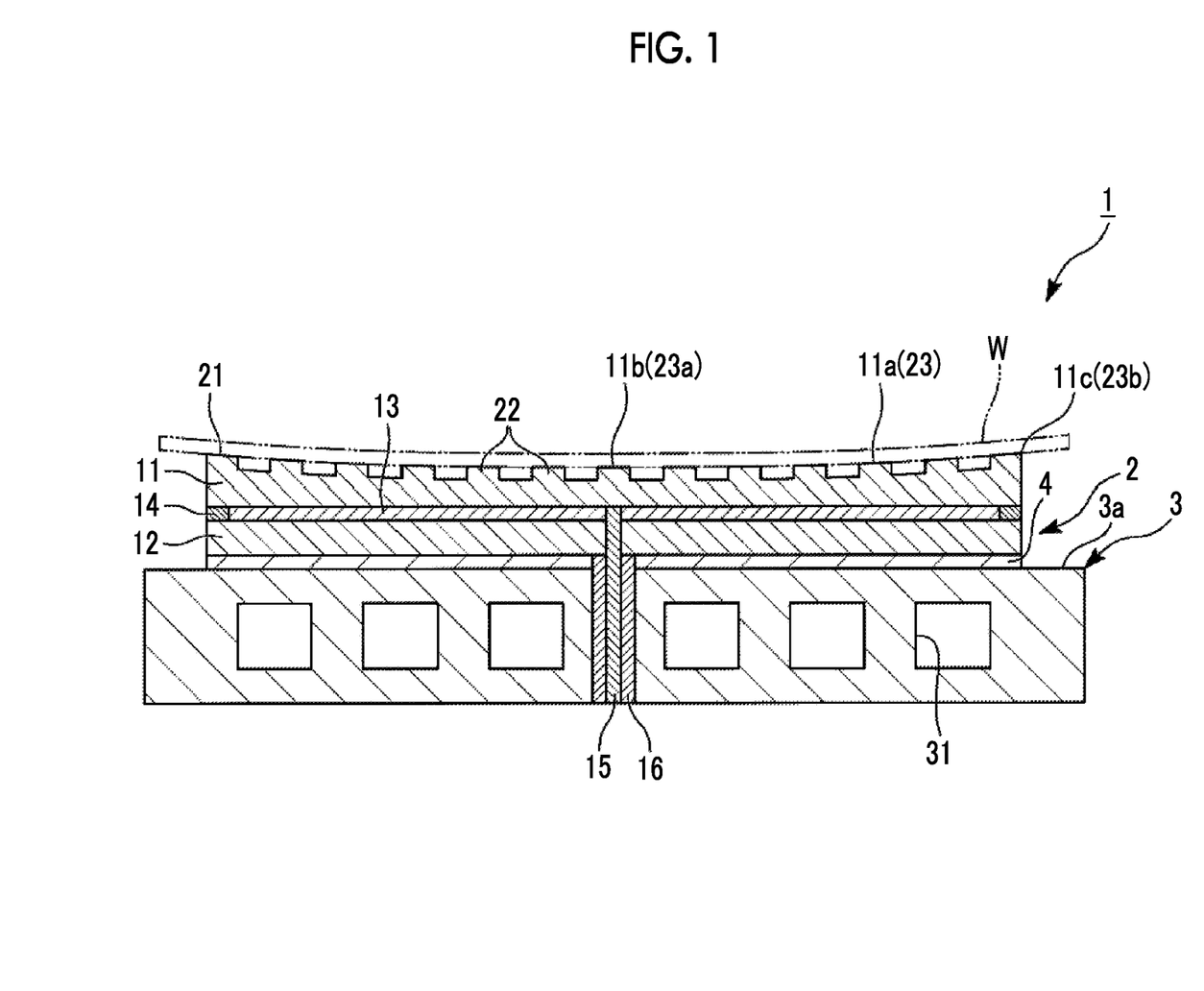
FIG. 1 is a schematic cross-sectional view showing a preferable example of an electrostatic chuck device according to a first embodiment.
Figure 2:
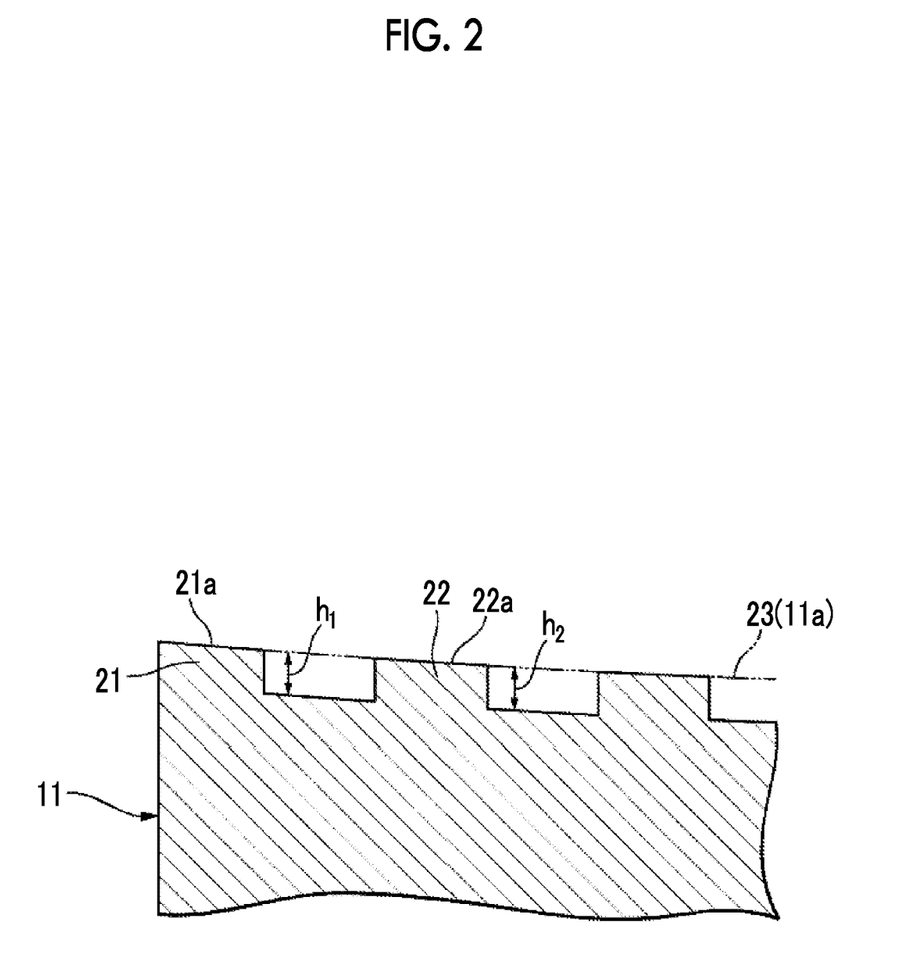
FIG. 2 is a partially enlarged cross-sectional view showing a vicinity of a peripheral portion of an electrostatic chuck part of the electrostatic chuck device according to the first embodiment shown in FIG. 1.

FIG. 1 is a cross-sectional view showing a preferable example of an electrostatic chuck device according to the present embodiment. FIG. 2 is a partially enlarged cross-sectional view showing a vicinity of a peripheral portion of an electrostatic chuck part of the electrostatic chuck device.

An electrostatic chuck device 1 shown in FIG. 1 includes a disk-shaped electrostatic chuck part 2 in plan view, a disk-shaped cooling base part 3 having a thickness for cooling the electrostatic chuck part 2 to a desired temperature, and an adhesive layer 4 for bonding and integrating the electrostatic chuck part 2 and the cooling base part 3.

[Electrostatic Chuck Part]

The electrostatic chuck part 2 includes a mounting plate (base material) 11, a support plate 12, an internal electrostatic attraction electrode 13, an insulating material layer 14, and a power supply terminal 15.

The mounting plate 11 has an upper surface (a main surface) as a mounting surface 11a on which a plate-like sample W such as a semiconductor wafer is mounted.

The support plate 12 is a member for supporting the mounting plate 11.

The internal electrostatic attraction electrode 13 is provided between the mounting plate 11 and the support plate 12.

The insulating material layer 14 is provided between the mounting plate 11 and the support plate 12 and is a layer for insulating the periphery of the internal electrostatic attraction electrode 13.

The power supply terminal 15 is a terminal for applying a direct-current voltage to the internal electrostatic attraction electrode 13.

Combination of the mounting plate 11 and the support plate 12 may be described as a base material.

An annular projection portion 21 having a square cross-section is preferably provided on a peripheral portion on the mounting surface 11a of the mounting plate 11 so as to make a round around the peripheral portion. Furthermore, a plurality of projection portions 22 having the same height as the annular projection portion 21 and having a circular cross-section and a substantially rectangular vertical cross-section are provided in a region surrounded by the annular projection portion 21 on the mounting surface 11a. As shown in FIG. 2, an upper end 21a of the annular projection portion 21 and an upper end 22a of each of the plurality of projection portions 22 are positioned on a concave surface 23 on which a bottom surface of a center 11b of the mounting surface 11a, that is, a bottom portion of a curved surface is positioned, respectively.

As shown in FIG. 1, a cross-sectional shape of the mounting plate 11 in a thickness direction includes a concave surface 23 having a curved shape that gradually curves from the center 11b of the mounting surface 11a toward an outer periphery 11c of the mounting surface 11a. More specifically, the cross-sectional shape of the mounting plate 11 in the thickness direction has the concave surface 23 having a curved shape (a curve projecting to a lower side (cooling base side) in the cross-sectional view) in which height of a surface of the mounting surface with reference to a position (height) of an upper surface (a main surface) 3a of the cooling base part 3 gradually increases and curves from the center 11b of the mounting surface 11a (the center 23a of the concave surface 23) to the outer periphery 11c of the mounting surface 11a (the outer periphery 23b of the concave surface 23). That is, the mounting surface 11a forms a concave surface 23. In other words, in plan view, the shape and the area of the mounting surface 11a and the shape and the area of the concave surface 23 are the same.

The cross-sectional shape of the mounting plate 11 in the thickness direction includes no inflection point. That is, the concave surface 23 does not have a point projecting in the thickness direction of the mounting plate 11 and a point recessed in the thickness direction of the mounting plate 11. Here, the inflection point can be obtained by measuring a surface profile of the mounting surface 11a of the mounting plate 11 using a three-dimensional measuring machine (trade name: RVA800A, manufactured by TOKYO SEIMITSU CO., LTD). Measurement points are set to the center of the mounting surface 11a, eight points at 45° intervals on a concentric circumference having a radius of 30 mm (eight orientations of 0°, 45°, 90°, 135°, 180°, 225°, 270°, and 315°), eight points at 45° intervals on a concentric circumference having a radius of 60 mm, eight points at 45° intervals on a concentric circumference having a radius of 90 mm, eight points at 45° intervals on a concentric circumference having a radius of 120 mm, and eight points at 45° intervals on a concentric circumference having a radius of 145 mm. Measurement is performed at 40 points. As necessary, the center of the mounting plate may be added as a point to be measured to perform an evaluation. A difference between heights of two points on adjacent concentric circles in the same orientation among the above eight orientations is calculated. For example, at 0°, a difference between heights of the point of the concentric circle having a radius of 30 mm and the point of the concentric circle having a radius of 60 mm (the height of the point having a large radius (for example, the height of the point having a radius of 60 mm)–the height of the point having a small radius (for example, the height of the point having a radius of 30 mm)) is calculated. Separately, measurement for a height and calculation for a height difference are performed on a point on a concentric circle (a radius of 60 mm) outside the adjacent concentric circles and a point on immediately outside the concentric circle, that is, another concentric circle (a radius of 90 mm) adjacent to the concentric circle, in the orientation. A point where a sign of the obtained calculation value is inverted as compared with a previous value is defined as an inflection point. The same measurement and calculation can be sequentially performed on other adjacent points to each other as necessary.

A case in which the inflection point is included can be explained as follows in a more easily understood manner. A surface profile of the mounting surface is measured by measuring heights at a measurement point, which is located on a center of the mounting surface, and at a plurality of measurement points, which are located on a plurality of concentric circles having different radiuses and on a straight line passing through the center of the mounting surface. Height differences between the measurement points, which are adjacent to each other and located on adjacent concentric circles, are obtained, respectively, based on values of the plurality of obtained heights. The height difference can be calculated according to a predetermined rule, and for example, it is preferable to subtract a value of the point which is located at an outer side from a value of the point which is located at an inner side, or vice versa. "Including inflection point" may mean that, when a plurality of values of the difference are confirmed, signs of the values of the height difference are not the same (that is, all the differences are not all plus or minus), and there is a point where the signs are changed from plus sign to minus sign or from minus sign to plus sign.

In addition, a difference between a height of the center 23a of the concave surface 23 with reference to a position (height) of a main surface 3a of the cooling base part 3 and a height of the outer periphery 23b of the concave surface 23 with reference to a position (height) of a main surface 3a of the cooling base part 3 can be optionally selected, but 1 μm or higher and 30 μm or lower is preferable, and 1 μm or higher and 15 μm or lower is more preferable.

In a case where the height difference is lower than 1 μm, desorption response of the plate-like sample W is undesirably reduced. On the other hand, in a case where the height difference is higher than 30 μm, a gap is generated between the plate-like sample W and the mounting surface 11a of the mounting plate 11 when the plate-like sample W is attracted, and as a result, ability to uniformize a temperature of the plate-like sample W deteriorates.

A surface roughness of the concave surface 23 can be optionally selected, but is preferably lower than 40 nm, more preferably 20 nm or lower.

In a case where the surface roughness of the concave surface 23 is lower than 40 nm, the plate-like sample W can be supported in a close contact state by the upper end 21a of the annular projection portion 21 and the upper end 22a of each of the plurality of projection portions 22. Therefore, particles can be hardly generated without rubbing at the contact surfaces between the upper ends 21a and 22a, and the plate-like sample W.

The surface roughness of the concave surface 23 in the electrostatic chuck device of the present embodiment is denoted by a so-called center line average surface roughness Ra. The surface roughness of the concave surface 23 in the electrostatic chuck device of the present embodiment can be measured using a surface roughness shape measuring machine (trade name: SURFCOM 1500SD3, manufactured by TOKYO SEIMITSU CO., LTD) in accordance with JIS B0601. In this measurement, a total of six points in three points each at 120° intervals on a concentric circumference are measured on the surface roughness of the concave surface 23, and an average value is adopted.

The annular projection portion 21 having a square cross-section is provided on a peripheral portion on the mounting surface 11a of the mounting plate 11 so as to make a round around the peripheral portion. Furthermore, a plurality of projection portions 22 having the same height as the annular projection portion 21 and having a circular cross-section and a substantially rectangular vertical cross-section are provided in a region surrounded by the annular projection portion 21 on the mounting surface 11a. As shown in FIG. 2, an upper end 21a of the annular projection portion 21 and an upper end 22a of each of the plurality of projection portions 22 are positioned on a concave surface 23 on which a bottom surface of a center point 11b of the mounting surface 11a is positioned. The bottom surface may mean a center of a curved surface.

The mounting plate 11 and the support plate 12 forming a main portion of the electrostatic chuck part 2 are preferably disk-shaped plates having the same overlapped surface shape. The mounting plate and the support plate are preferably made of ceramics having an electric resistance of $1 \times 10^{14}$ Ω·cm or higher and a relative permittivity at a frequency of 20 Hz of 13 or higher, and preferably 18 or higher. Here, the reason why the electric resistance of the mounting plate 11 and the support plate 12 is limited to $1 \times 10^{14}$ Ω·cm or higher and the relative permittivity at a frequency of 20 Hz is limited to 13 or higher is that the above ranges are ranges in which the temperature of the plate-like sample W is uniform and a leakage amount (leak amount) of a sealing medium decreases so as to stabilize plasma.

Here, in a case where the electric resistance is lower than $1 \times 10^{14}$ Ω·cm, there is a possibility that insulating properties as a base material become insufficient. Therefore, due to an increase in a current leaking to the attracted plate-like sample W, there are possibilities that a device formed on the plate-like sample W is destroyed and a desorption failure of the plate-like sample W accompanied with an increase in residual attraction force occurs, which are not preferable.

Furthermore, when the relative permittivity at the frequency of 20 Hz is lower than 13, in a case where a voltage is applied between the plate-like sample W and the internal electrostatic attraction electrode 13, there is a possibility that sufficient electrostatic attraction force for attracting the plate-like sample W cannot be generated. As a result, there is a possibility to attract and fix the plate-like sample W to the concave surface 23, which is not preferable.

When used in an etching device generating plasma at high-frequency, it is preferable that the relative permittivity at 1 MHz or higher is smaller than the relative permittivity at 20 Hz in terms of high-frequency transmittance.

An example of ceramics forming the mounting plate 11 and the support plate 12 preferably includes insulating ceramics having mechanical strength and durability against corrosive gas and plasma thereof such as an aluminum oxide-silicon carbide ($Al_2O_3$—SiC) composite sintered compact, an aluminum oxide ($Al_2O_3$) sintered compact, an aluminum nitride (AlN) sintered compact, an yttrium oxide ($Y_2O_3$) sintered compact. However, ceramics is not limited only thereto.

A particle diameter of such ceramics that can be used for forming the mounting plate and the support plate is preferably 2 μm or lower, more preferably 1 μm or lower. Therefore, the particle diameter of the ceramics is 2 μm or lower, so that the following effects are obtained. In other words, by using ceramics having a small particle diameter, generation of particles due to a rub between the plate-like sample W, and the annular projection portion 21 and the plurality of projection portions 22 generated together with deformation of the plate-like sample W during attraction can be suppressed.

In addition, since the particle diameter is small, a width and a height of the annular projection portion 21 and heights and sizes of the plurality of projection portions 22 can be reduced. Thereby, the contact area between the annular projection portion 21 and the plurality of projection portions 22, and the plate-like sample W can be reduced.

In the annular projection portion 21 and the plurality of projection portions 22 provided on the mounting surface 11a of the mounting plate 11, the upper end 21a of the annular projection portion 21 and the upper end 22a of each of the plurality of projection portions 22 are positioned on the concave surface 23 having a center portion as the bottom surface (bottom of the curved surface) of the mounting surface 11a. Therefore, the plate-like sample W, and the annular projection portion 21 and the plurality of projection portions 22 can be reliably in contact with each other on the entire surface of the plate-like sample W. Therefore, when the plate-like sample W is attracted or desorbed, the plate-like sample W is not deformed, and the temperature of the plate-like sample W is also made uniform.

The upper end 21a of the annular projection portion 21 and the upper ends 22a of the plurality of projection portions 22 are positioned on the concave surface 23 when viewed from the cross-section. As a result, the plate-like sample W is supported by the annular projection portion 21 and the plurality of projection portions 22 in the close contact state with each other, and a gap, a rub, or the like is not generated between the plate-like sample W, and the annular projection portion 21 and the plurality of projection portions 22. Therefore, particles are hardly generated.

In the annular projection portion 21, the surface roughness Ra of the upper end 21a is preferably set to 0.001 μm or higher and lower than 0.040 μm in order to make the leak amount when the plate-like sample W is mounted and sealed constant at each position on the outer peripheral portion.

Furthermore, the upper end 21a of the annular projection portion 21 and the upper end 22a of each of the plurality of projection portions 22 are preferably within a height range of ±1 μm from the concave surface 23, and more preferably ±0.5 μm.

As described above, the upper end 21a of the annular projection portion 21 and the upper end 22a of each of the plurality of projection portions 22 are within the range of height ±1 μm from the concave surface 23, so that the upper end 21a of the annular projection portion 21 and The upper end 22a of each of the plurality of projection portions 22 is positioned on the concave surface 23 within the range of height ±1 μm. As a result, the upper ends 21a and 22a, and the plate-like sample W are more reliably in contact with each other on the entire surface of the plate-like sample W. Therefore, when the plate-like sample W is attracted or desorbed, the plate-like sample W is not deformed, and the temperature of the plate-like sample W is further made uniform.

In the annular projection portion 21 and the plurality of projection portions 22 provided on the mounting surface 11a of the mounting plate 11, a height $h_1$ from the mounting surface 11a to the upper end 21a of the annular projection portion 21 is the same as a height $h_2$ from the mounting surface 11a to the upper end 22a of each of the plurality of projection portions 22. In addition, a region other than the annular projection portion 21 and the plurality of projection portions 22 of the mounting surface 11a, in other words, a gap between the projection portions is a flow channel for flowing a sealing medium such as nitrogen gas or helium gas.

As described above, the height $h_1$ from the mounting surface 11a to the upper end 21a of the annular projection portion 21 is set to the same as the height $h_2$ from the mounting surface 11a to the upper end 22a of each of the plurality of projection portions 22. Thereby, a depth of the flow channel for flowing the sealing medium such as nitrogen gas or helium gas surrounded by the annular projection portion 21 and the plurality of projection portions 22 on the mounting surface 11a becomes constant. Therefore, heat transfer in the flow channel of the sealing medium becomes constant, and a temperature of the plate-like sample W is made uniform, so that plasma can be stably generated.

A difference between a height from the main surface 3a of the cooling base part 3 to the upper end 21a of the annular projection portion 21 and a height from the main surface 3a to the upper end 22a of the projection portion 22 positioned in a vicinity of the center of the mounting surface 11a is preferably 1 μm or higher and 30 μm or lower, and more preferably 1 μm or higher and 15 μm or lower.

In this manner, in a case where the difference between the height from the main surface 3a of the cooling base part 3 to the upper end 21a of the annular projection portion 21 and the height from the main surface 3a to the upper end 22a of the projection portion 22 positioned in the vicinity of the center of the mounting surface 11a is 1 μm or higher and 30 μm or lower, the following effects can be obtained. That is, even when the electrostatic chuck part 2 is fixed to the cooling base part 3 with a fixing tool such as a bolt, the electrostatic chuck part 2 is not deformed, and stable characteristics can be obtained.

In addition, the plate-like sample W is unlikely excessively deformed during electrostatic attraction, and a problem such as breakage of the plate-like sample W is prevented.

The sum of an area of the upper end 21a of the annular projection portion 21 and a total area of the upper end 22a of each of the plurality of projection portions 22 can be optionally selected, but is preferably 30% or lower of the area of the mounting surface 11a, and more preferably 25% or lower.

Here, in a case where the sum of an area of the upper end 21a of the annular projection portion 21 and a total area of the upper end 22a of each of the plurality of projection portions 22 is preferably 30% or lower of the area of the mounting surface 11a, the following effects can be obtained. That is, a ratio of the total area of the flow channel of the sealing medium such as nitrogen gas or helium gas to the area of the mounting surface 11a can be increased. Therefore, thermal uniformity of the sealing medium can be improved.

As a result, the leakage amount (leak amount) of the sealing medium can be reduced, and plasma can be stably generated.

A total thickness of the mounting plate 11, the support plate 12, the internal electrostatic attraction electrode 13 and the insulating material layer 14, that is, a thickness of the electrostatic chuck part 2 can be optionally set, but is preferably 1 mm or higher and 10 mm or lower. In a case where the thickness of the electrostatic chuck part 2 is 1 mm or higher, mechanical strength of the electrostatic chuck part 2 can be ensured. On the other hand, in a case where the thickness of the electrostatic chuck part 2 is 10 mm or lower, heat capacity of the electrostatic chuck part 2 does not become too large, and thermal response of the plate-like sample W to be mounted is not deteriorated. Furthermore, an in-plane temperature of the plate-like sample W can be maintained at a desired temperature pattern without increasing the heat transfer of the electrostatic chuck part in the lateral direction.

Particularly, the thickness of the mounting plate 11 can be optionally set, but is preferably 0.3 mm or higher and 2.0 mm or lower. The reason is that in a case where the thickness of the mounting plate 11 is 0.3 mm or higher, there is no discharging risk due to the voltage applied to the internal electrostatic attraction electrode 13. On the other hand, in a case where the thickness of the mounting plate 11 is 2.0 mm or lower, the plate-like sample W can be sufficiently attracted and fixed, and the plate-like sample W can be sufficiently heated.

The main surface, which is other than the mounting surface, of the mounting plate, and two main surfaces of the support plate may be flat surfaces.

The internal electrostatic attraction electrode 13 is an electrode used as an electrode for an electrostatic chuck in order to generate an electric charge and fix a plate-like sample by electrostatic attraction force. A shape and size of the internal electrostatic attraction electrode 13 are appropriately adjusted depending on a use.

The internal electrostatic attraction electrode 13 can be formed from any material, for example, conductive ceramics such as an aluminum oxide-tantalum carbide ($Al_2O_3$—$Ta_4C_5$) conductive composite sintered compact, an aluminum oxide-tungsten ($Al_2O_3$—W) conductive composite sintered compact, an aluminum oxide-silicon carbide ($Al_2O_3$—SiC) conductive composite sintered compact, an aluminum nitride-tungsten (AlN—W) conductive composite sintered compact, an aluminum nitride-tantalum (AlN—Ta) conductive composite sintered compact, an yttrium oxide-molybdenum ($Y_2O_3$—Mo) conductive composite sintered compact, or a high melting point metal such as tungsten (W), tantalum (Ta), and molybdenum (Mo).

A thickness of the internal electrostatic attraction electrode 13 is not particularly limited and can be optionally selected, but is preferably 5 μm or higher and 40 μm or lower, particularly preferably 20 μm or higher and 30 μm or lower. In a case where the thickness of the internal electrostatic attraction electrode 13 is 5 μm or higher, sufficient conductivity can be ensured. On the other hand, in a case where the thickness of the internal electrostatic attraction electrode 13 is 40 μm or lower, cracks due to a difference in a thermal expansion coefficient between the internal electrostatic attraction electrode 13, and the mounting plate 11 and the support plate 12 are less likely to be formed at a bonding interface between the internal electrostatic attraction electrode 13, and the mounting plate 11 and the support plate 12.

The internal electrostatic attraction electrode 13 can be formed by a method that can be optionally selected, and can be easily formed by, for example, a film forming method such as a sputtering method or a vapor deposition method, or a coating method such as a screen printing method.

The insulating material layer 14 surrounds the internal electrostatic attraction electrode 13, and protects the internal electrostatic attraction electrode 13 from corrosive gas and plasma thereof. In addition, this layer is a layer in which boundary portions between the mounting plate 11 and the support plate 12, that is, outer peripheral regions other than the internal electrostatic attraction electrode 13 are bonded and integrated with each other. The insulating material layer 14 is preferably formed of insulating materials having the same composition or the same main component as materials forming the mounting plate 11 and the support plate 12.

The power supply terminal 15 is a rod-shaped terminal provided in order to apply a direct-current voltage to the internal electrostatic attraction electrode 13. Materials of the power supply terminal 15 are not particularly limited as long as the materials are conductive materials having excellent heat resistance, and it is preferable that a thermal expansion coefficient approximates to the thermal expansion coefficient of the internal electrostatic attraction electrode 13 and the support plate 12. For example, conductive ceramics for forming the internal electrostatic attraction electrode 13 or metal materials such as tungsten (W), tantalum (Ta), molybdenum (Mo), niobium (Nb), and Kovar alloy are preferably used.

The power supply terminal 15 is insulated from the cooling base part 3 by using an insulator 16 having an insulating property.

The power supply terminal 15 is bonded and integrated with the support plate 12, and the mounting plate 11 and the support plate 12 are bonded and integrated by the internal electrostatic attraction electrode 13 and the insulating material layer 14 to form the electrostatic chuck part 2.

[Cooling Base Part]

The cooling base part 3 is a member for cooling the electrostatic chuck part 2 to maintain a temperature within a desired range, and is a thick disk-shaped member.

As the cooling base part 3, for example, a base such as a water-cooling base in which a flow channel 31 for circulating a cooling medium such as water is formed therein is preferable.

The material forming the cooling base part 3 is not particularly limited and may be any metal having excellent thermal conductivity, conductivity, and workability, or a composite material containing the metals. For example, materials selected from aluminum (Al), aluminum alloy, copper (Cu), copper alloy, stainless steel (SUS) and the like are preferably used. It is preferable that at least a surface of the cooling base part 3 exposed to plasma is subjected to insulation treatment. As such an insulation treatment, alumite treatment or insulation film treatment of applying an insulation film of alumina or the like is preferable.

[Adhesive Layer]

The adhesive layer 4 is used for bonding and integrating the electrostatic chuck part 2 with the cooling base part 3.

A thickness of the adhesive layer 4 can be optionally selected and is preferably 100 µm or higher and 200 µm or lower, more preferably 130 µm or higher and 170 µm or lower.

In a case where the thickness of the adhesive layer 4 is within the above range, an adhesive strength between the electrostatic chuck part 2 and the cooling base part 3 can be sufficiently maintained. Furthermore, sufficient thermal conductivity between the electrostatic chuck part 2 and the cooling base part 3 can be ensured.

Materials of the adhesive layer 4 can be optionally selected, and for example, can be formed of a cured body obtained by heating and curing a silicone-based resin composition, an acrylic resin, an epoxy resin, or the like.

The silicone-based resin composition is preferably a silicon compound having a siloxane bond (Si—O—Si) since a resin has excellent heat resistance and elasticity.

As such a silicone-based resin composition, a silicone resin having a thermosetting temperature of 70° C. to 140° C. is particularly preferable.

Here, in a case where the thermosetting temperature is lower than 70° C., the curing is not sufficiently performed in a bonding process when the electrostatic chuck part 2 and the cooling base part 3 are bonded in a state of being opposed to each other. Therefore, there is a possibility that usability deteriorates, which is not preferable. On the other hand, in a case where the thermosetting temperature higher than 140° C., a difference in thermal expansion between the electrostatic chuck part 2 and the cooling base part 3 is large, and stress between the electrostatic chuck part 2 and the cooling base part 3 increases. Therefore, there is a possibility that peeling may occur therebetween, which is not preferable.

As the silicone resin, a resin having a Young's modulus of 8 MPa after curing or lower is preferable. Here, in a case where the Young's modulus after curing is higher than 8 MPa, the difference in thermal expansion between the electrostatic chuck part 2 and the cooling base part cannot be offset when a heat cycle of increasing and decreasing the temperature is applied to the adhesive layer 4. Therefore, there is a possibility that durability of the adhesive layer 4 is reduced, which is not preferable.

The adhesive layer 4 preferably contains a filler and the like formed of inorganic oxide, inorganic nitride, or inorganic oxynitride having an average particle diameter of 1 µm or higher and 30 µm or lower, preferably 1 µm or higher and 20 µm or lower, and more preferably 1 µm or higher and 10 µm or lower. For example, it is preferable to contain surface-coated aluminum nitride (AlN) particles on which a coating layer consisting of silicon oxide ($SiO_2$) is formed on surfaces of aluminum nitride (AlN) particles.

The surface-coated aluminum nitride (AlN) particles are preferably mixed to improve a thermal conductivity of the silicone resin, and a heat transfer coefficient of the adhesive layer 4 can be controlled by adjusting a mixing ratio thereof.

That is, the mixing ratio of the surface-coated aluminum nitride (AlN) particles is increased, so that the heat transfer coefficient of an organic adhesive forming the adhesive layer 4 can be increased.

A coating layer consisting of silicon oxide ($SiO_2$) is formed on the surfaces of the aluminum nitride (AlN) particles. Therefore, the coating layer has excellent water resistance as compared with mere aluminum nitride (AlN) particles on which the surfaces is not coated. Therefore, the durability of the adhesive layer 4 containing the silicone-based resin composition as a main component can be ensured. As a result, durability of the electrostatic chuck device 1 can be significantly improved.

For example, in the surface-coated aluminum nitride (AlN) particles, surfaces of aluminum nitride (AlN) particles are coated with a coating layer consisting of silicon oxide ($SiO_2$) having excellent water resistance. As a result, aluminum nitride (AlN) is not hydrolyzed by water in the atmosphere, the heat transfer coefficient of aluminum nitride (AlN) is not reduced, and the durability of the adhesive layer 4 is improved.

The surface-coated aluminum nitride (AlN) particles are not subjected to a contaminant source for the plate-like sample W such as a semiconductor wafer, and can be regarded as a preferable filler from this point as well.

The adhesive layer 4 may be formed of a thermosetting acrylic resin adhesive having a Young's modulus of 1 GPa or lower and flexibility (Shore hardness of A100 or lower). In this case, the filler may or may not be contained.

According to the electrostatic chuck device 1 of the present embodiment, a surface of the cross-sectional shape of the mounting plate 11 in a thickness direction is the concave surface 23 having the curved shape that gradually curves from the center 11*b* of the mounting surface 11*a* toward the outer periphery 11*c* of the mounting surface 11*a*. The curved surface of the concave surface does not include the inflection point, and a difference between the height of the center 23*a* of the concave surface 23 with reference to a position of the main surface 3*a* of the cooling base part 3 and the height of the outer periphery 23*b* of the concave surface 23 with reference to a position of the main surface 3*a* of the cooling base part 3 is 1 μm or higher and 30 μm or lower. Therefore, local contact between the plate-like sample W and the concave surface 23 can be prevented. Furthermore, during electrostatic attraction, the plate-like sample W is deformed to follow the shape of the concave surface 23, and the plate-like sample W is brought into close contact with the concave surface 23 without any gap. Therefore, the attraction force of the plate-like sample W with respect to the concave surface 23 is improved. Thereby, the surface temperature of the plate-like sample W attracted on the electrostatic chuck device 1 can be made uniform.

Furthermore, according to the electrostatic chuck device 1 of the present embodiment, the annular projection portion 21 is provided on the peripheral portion on the mounting surface 11*a* of the mounting plate 11, and the plurality of projection portions 22 having the same height as the annular projection portion 21 is provided in the region surrounded by the annular projection portion 21 on the mounting surface 11*a*, and the upper end 21*a* of the annular projection portion 21 and the upper end 22*a* of each of the plurality of projection portions 22 are positioned on the concave surface 23 whose bottom surface (bottom of the curved surface) is a center portion of the mounting surface 11*a*. Therefore, when the plate-like sample W is attracted or desorbed, the plate-like sample W is not deformed, and the temperature of the plate-like sample W can be made uniform.

In addition, the plate-like sample W can be supported in the close contact state by the upper end 21*a* of the annular projection portion 21 and the upper end 22*a* of each of the plurality of projection portions 22. Therefore, particles can be hardly generated without rubbing at the contact surfaces between the upper ends 21*a* and 22*a*, and the plate-like sample W.

Method of Manufacturing Electrostatic Chuck Device (1)

A method of manufacturing an electrostatic chuck device according to the present embodiment is a method of manufacturing an electrostatic chuck device according to the present embodiment. In this method, a step of bonding the electrostatic chuck part and the cooling base part through an adhesive (a bonding step), and a step of processing (a processing step) the mounting surface of the mounting plate of the electrostatic chuck part bonded to the cooling base part, that is, the cross-sectional shape of the base material (electrostatic chuck part) in the thickness direction includes the concave surface or the convex surface which has a gentle curved shape that gradually curves from the center of the mounting surface of the mounting plate toward the outer periphery of the mounting surface of the mounting plate and includes no inflection point.

Hereinafter, a method of manufacturing an electrostatic chuck device according to the present embodiment will be described.

First, a pair of plate-shaped bodies serving as the mounting plate 11 and the support plate 12 are prepared from an aluminum oxide-silicon carbide ($Al_2O_3$—SiC) composite sintered compact or an yttrium oxide ($Y_2O_3$) sintered compact.

For example, a mixed powder containing a silicon carbide powder and an aluminum oxide powder, or an yttrium oxide powder is formed into a desired shape to obtain two molded bodies. Thereafter, the molded bodies are calcinated at a temperature of about 1400° C. to 2000° C. in a non-oxidizing atmosphere, preferably in an inert atmosphere for a predetermined time. Thereby, a pair of plate-shaped bodies (a first plate-shaped body and a second plate-shaped body) can be obtained.

Next, a plurality of fixing holes for fitting and maintaining the power supply terminal 15 are formed on one first plate-shaped body, and the power supply terminal 15 is fixed to the fixing hole.

Next, a coating liquid for forming an internal electrostatic attraction electrode, preferably a coating liquid for forming an internal electrostatic attraction electrode in which a conductive material such as the above described conductive ceramics is dispersed in an organic solvent, is applied to a predetermined region of a surface of the first plate-shaped body on which the power supply terminal 15 is fitted, so as to contact with the power supply terminal 15. A coating film is dried to form a layer formed of an internal electrostatic attraction electrode. Furthermore, an insulating material layer containing powder materials having the same composition or the same main component as the plate-shaped body is formed in a region other than the region where the layer formed of an internal electrostatic attraction electrode is formed on the plate-shaped body. The insulating material layer forms the insulating material layer 14.

Next, an other second plate-shaped body is overlapped on the layer formed of an internal electrostatic attraction electrode and the insulating material layer formed on the one plate-shaped body, and the entire layers are integrated by hot pressing at a high temperature and a high pressure. The atmosphere in the hot pressing is preferably a vacuum or an inert atmosphere such as Ar, He, or $N_2$.

Furthermore, the pressure when uniaxial pressing is performed in the hot pressing can be optionally selected, but is preferably 5 MPa to 10 MPa, and the temperature is preferably 1400° C. to 1850° C.

By the hot pressing, the layer of an internal electrostatic attraction electrode is calcinated to form an internal electrostatic attraction electrode 13 formed of a conductive composite sintered compact. At the same time, the two plate-shaped bodies each become the mounting plate 11 and the support plate 12 and are bonded and integrated with the internal electrostatic attraction electrode 13 and the insulating material layer 14 to form the electrostatic chuck part 2.

Next, an adhesive consisting of a silicone-based resin composition is applied to a predetermined region of a main surface 3*a* of the cooling base part 3. Here, an application amount of the adhesive is adjusted so that the electrostatic chuck part 2 and the cooling base part 3 can be bonded and integrated with each other.

Examples of a method for applying the adhesive include a bar coating method, a screen printing method, and the like in addition to an application method using a spatula or the like by hand.

After applying the adhesive to the main surface 3a of the cooling base part 3, the electrostatic chuck part 2 and the cooling base part 3 to which the adhesive is applied are overlapped.

In addition, the power supply terminal 15 and the insulator 16, which are provided in a standing state, are inserted and fitted into the power supply terminal receiving hole drilled through the cooling base part 3.

Next, the electrostatic chuck part 2 is pressed against the cooling base part 3 at a predetermined pressure, and the electrostatic chuck part 2 and the cooling base part 3 are bonded and integrated with each other. As a result, the electrostatic chuck part 2 and the cooling base part 3 are bonded and integrated through the adhesive layer 4.

Next, for example, a surface protection tape is stuck on a side surface (the surface along the thickness direction of a laminate) and a back surface (the surface opposite to the mounting surface 11a of the mounting plate 11 of the electrostatic chuck part 2) of a laminate including the electrostatic chuck part 2, the adhesive layer 4, and the cooling base part 3, as necessary so that the surfaces are not scratched or particles are not adhered thereto. In this manner, the side surface and the back surface of the laminate are masked, and only the mounting surface 11a of the mounting plate 11 is exposed.

Next, the mounting surface 11a of the mounting plate 11 of the electrostatic chuck part 2 is subjected to grinding processing and polishing processing. The cross-sectional shape of the mounting plate 11 in the thickness direction forms a curved shape that curves in such a manner that a surface height with reference to a position of the main surface 3a of the cooling base part 3 is gradually increased from the center 23a of the concave surface 23 (the center 11b of the mounting surface 11a) toward the outer periphery 23b of the concave surface 23 (corresponding to the outer periphery of the mounting surface 11a).

In the above described grinding processing and polishing processing, the processing can be performed using preferable equipment and conditions as necessary.

Next, mechanical processing such as blasting processing is performed on a predetermined position of the mounting surface 11a of the mounting plate 11 of the electrostatic chuck part 2. Thus, the annular projection portion 21 and the plurality of projection portions 22 are formed, and a bottom surface portion excluding the annular projection portion 21 and the plurality of projection portions 22 is formed. The annular projection portion 21 and the plurality of projection portions 22 serve as the mounting surface 11a of the mounting plate 11.

Next, the surface protection tape is removed from the laminate including the electrostatic chuck part 2, the adhesive layer 4, and the cooling base part 3.

Then, washing is performed by an optionally selected method. For example, particles remaining on the concave surface 23 of the electrostatic chuck part 2 and the mounting surface 11a of the mounting plate 11 (processing waste of the mounting plate 11) are removed by ultrasonic cleaning in ultrapure water. Furthermore, after removing the adhesive remaining on the side surface and the back surface of the laminate by wiping with alcohol, the laminate is dried by a dryer.

As described above, the electrostatic chuck part 2 and the cooling base part 3 are bonded and integrated through the adhesive layer 4 and the annular projection portion 21 and the plurality of the projection portions 22 are formed on the mounting surface 11a of the mounting plate 11 of the electrostatic chuck part 2. Obtained is the electrostatic chuck device 1 of the present embodiment in which the cross-sectional shape of the mounting plate 11 in the thickness direction having a curved shape formed to be bent in such a manner that height with reference to the main surface 3a of the cooling base part 3 is gradually increased from the center 23a of the concave surface 23 toward the outer periphery 23b of the concave surface 23.

According to the method of manufacturing an electrostatic chuck device of the present embodiment, the electrostatic chuck device 1 in which attraction force of the plate-like sample W to the concave surface 23 is improved is obtained.

(2) Second Embodiment

Electrostatic Chuck Device

Figure 3:
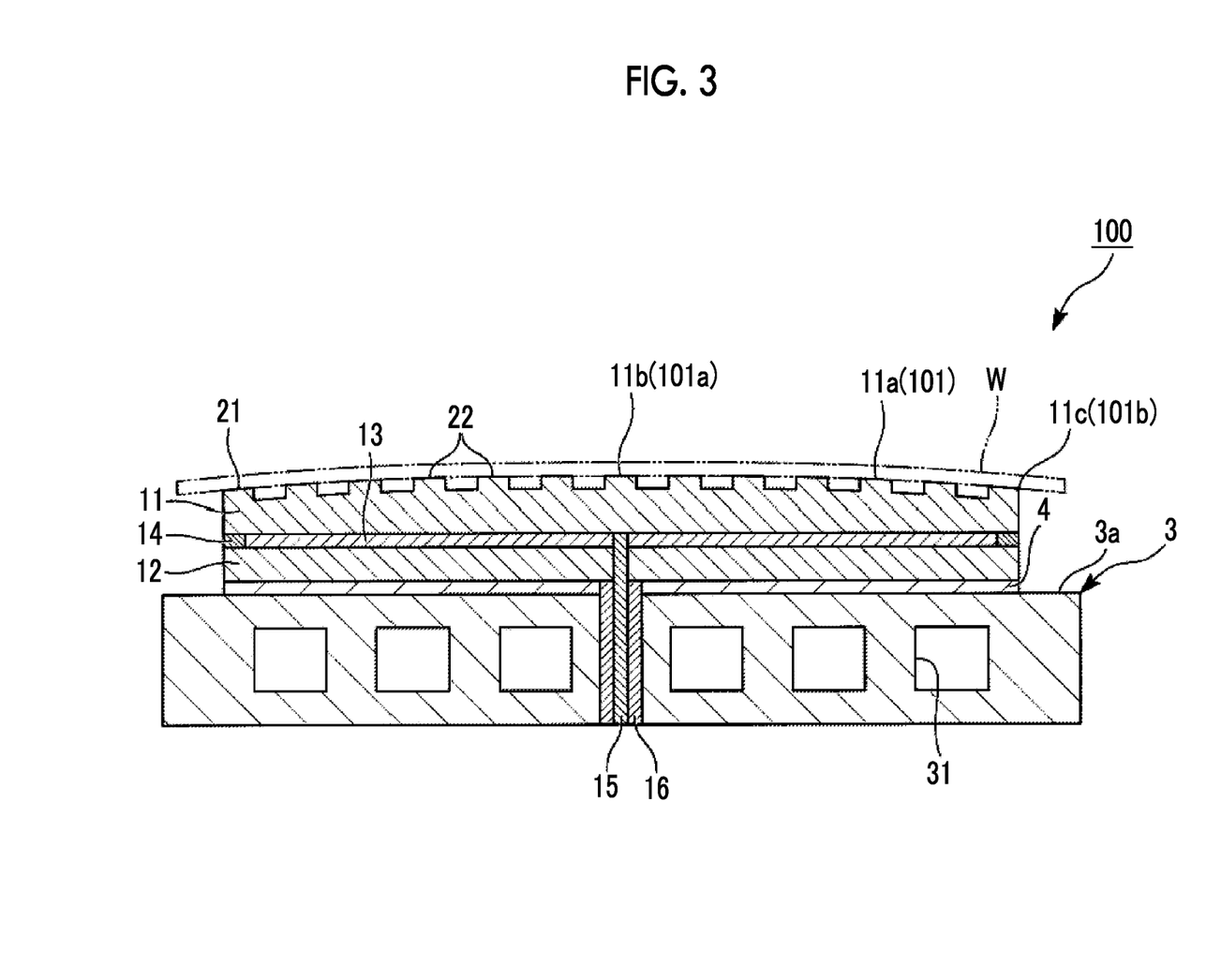
FIG. 3 is a schematic cross-sectional view showing a preferable example of an electrostatic chuck device according to a second embodiment.

FIG. 3 is a cross-sectional view showing a preferable example of an electrostatic chuck device according to the present embodiment.

In FIG. 3, the same components as the electrostatic chuck device according to the first embodiment shown in FIG. 1 are denoted by the same reference numerals, and duplicate descriptions will not be repeated.

An electrostatic chuck device 100 shown in FIG. 3 includes a disk-shaped electrostatic chuck part 2 in plan view, a disk-shaped cooling base part 3 having a thickness for cooling the electrostatic chuck part 2 to a desired temperature, and an adhesive layer 4 for bonding and integrating the electrostatic chuck part 2 and the cooling base part 3.

A difference between the electrostatic chuck device 100 of the present embodiment and the electrostatic chuck device 1 of the first embodiment described above is that, as shown in FIG. 3, the cross-sectional shape of the mounting plate 11 in the thickness direction forms a convex surface 101 having the curved shape that gradually curves (an upwardly projecting curve (a side on which a plate-like sample is disposed) in the cross-sectional view) from the center 11b of the mounting surface 11a toward the outer periphery 11c of the mounting surface 11a. Specifically, the cross-sectional shape of the mounting plate 11 in the thickness direction is formed to have the convex surface 101 having the curved shape to be gently bent in such a manner that a surface height with reference to a position of an upper surface 3a (a main surface) of the cooling base part 3 is gradually decreased from the center 11b of the mounting surface 11a (a center 101a of the convex surface 101) toward the outer periphery 11c of the mounting surface 11a (the outer periphery 101b of the convex surface 101). That is, the mounting surface 11a forms the convex surface 101. In other words, in plan view, a shape and an area of the mounting surface 11a and a shape and an area of the convex surface 101 are the same.

In the electrostatic chuck device 100 of the present embodiment, the cross-sectional shape of the mounting plate 11 in the thickness direction includes no inflection point. That is, the convex surface 101 does not have a point projecting in the thickness direction of the mounting plate 11 and a point recessed in the thickness direction of the mounting plate 11. That is, the convex surface 101 has a smoothly continuous curved surface and has substantially no convex and concave.

In addition, when the electrostatic chuck device 100 of the present embodiment is viewed from the cross-section, a difference between a height of the center 101a of the convex surface 101 with reference to a position (height) of a main surface 3a of the cooling base part 3 and a height of the outer periphery 101b of the convex surface 101 with reference to a position (height) of a main surface 3a of the cooling base part 3 is 1 µm or higher and 30 µm or lower, and preferably 1 µm or higher and 15 µm or lower.

In a case where the height difference is lower than 1 µm, desorption response of the plate-like sample W may be reduced, thus which is not preferable. On the other hand, in a case where the height difference is higher than 30 µm, a gap is generated between the plate-like sample W and the mounting surface 11a of the mounting plate 11 when the plate-like sample W is attracted, and as a result, ability to uniformize a temperature of the plate-like sample W may deteriorate.

In addition, a surface roughness of the convex surface 101 can be optionally selected, but is preferably lower than 40 nm, more preferably 20 nm or lower.

In a case where the surface roughness of the convex surface 101 is lower than 40 nm, the plate-like sample W is preferably supported in a close contact state by the upper end 21a of the annular projection portion 21 and the upper end 22a of each of the plurality of projection portions 22. As a result, particles can be hardly generated without rubbing at the contact surfaces between the upper ends 21a and 22a, and the plate-like sample W.

The surface roughness of the convex surface 101 in the electrostatic chuck device of the present embodiment is measured by the same manner as the first embodiment.

According to the electrostatic chuck device 100 of the present embodiment, the cross-sectional shape of the mounting plate 11 in a thickness direction has the convex surface 101 having the curved shape that gradually curves from the center 11b of the mounting surface 11a toward the outer periphery 11c of the mounting surface 11a. In addition, the cross-sectional shape does not include inflection points, and a difference between the height of the center 101a of the convex surface 101 with reference to a position of the main surface 3a of the cooling base part 3 and the height of the outer periphery 101b of the convex surface 101 with reference to a position of the main surface 3a of the cooling base part 3 is 1 µm or higher and 30 µm or lower.

Therefore, while preventing local contact between the plate-like sample W and the convex surface 101, the plate-like sample W is deformed to follow the shape of the convex surface 101 during electrostatic attraction, and the plate-like sample W is brought into close contact with the convex surface 101 without any gap. Therefore, the attraction force of the plate-like sample W to the convex surface 101 is improved. Thereby, the surface temperature of the plate-like sample W attracted on the electrostatic chuck device 1 can be made uniform. In addition, the desorption response of the plate-like sample W is also improved.

Method of Manufacturing Electrostatic Chuck Device (2)

A method of manufacturing an electrostatic chuck device according to the present embodiment is similar to the method of manufacturing an electrostatic chuck device according to the first present embodiment described above.

The method of manufacturing an electrostatic chuck device according to the present embodiment differs from the method of manufacturing an electrostatic chuck device according to the first present embodiment described above in the following point. That is, in the step of performing grinding processing and polishing processing on the mounting surface 11a of the mounting plate 11 of the electrostatic chuck part 2, the grinding processing and the polishing processing are performed on the mounting surface 11a of the mounting plate 11 so that the cross-sectional shape of the mounting plate 11 in the thickness direction is processed to form a curved shape to be bent in such a manner that a height with reference to a position of the main surface 3a of the cooling base part 3 is gradually decreased from the center 101a of the convex surface 101 (the center 11b of the mounting surface 11a) toward the outer periphery 101b of the convex surface 101 (corresponding to the outer periphery of the mounting surface 11a).

According to the method of manufacturing an electrostatic chuck device of the present embodiment, the electrostatic chuck device 100 in which attraction force of the plate-like sample W to the convex surface 101 is improved is obtained.

EXAMPLES

Hereinafter, the present invention will be described more specifically with reference to Examples and Comparative Examples, but the present invention is not limited to the following Examples.

Example 1

Preparation of Electrostatic Chuck Device

According to a known method, an electrostatic chuck part having a thickness of 25 µm of an internal electrostatic attraction electrode embedded therein was prepared.

A mounting plate of the electrostatic chuck part was a composite sintered compact of aluminum oxide-silicon carbide containing 8.5% by mass of silicon carbide, and was a disk having a diameter of 450 mm and a thickness of 4.0 mm.

In addition, a support plate was also a composite sintered compact of aluminum oxide-silicon carbide containing 8.5% by mass of silicon carbide, and was a disk having a diameter of 450 mm and a thickness of 4.0 mm as well as the mounting plate of the electrostatic chuck part.

Next, the mounting plate and the support plate were bonded and integrated so that the internal electrostatic attraction electrode was formed therebetween, thereby preparing the electrostatic chuck part. Thereafter, polishing processing was performed on the entire thickness of the electrostatic chuck part to be 3.0 mm, and on a surface of the mounting plate to be a flat surface.

On the other hand, an aluminum cooling base part having a diameter of 400 mm and a height of 30 mm was prepared by machining processing. A flow channel for circulating a refrigerant was formed inside the cooling base part. A power supply terminal receiving hole was also formed on the base part.

Next, an adhesive consisting of a silicone-based resin composition is applied to a predetermined region of a main surface of the cooling base part. Thereafter, the electrostatic chuck part and the cooling base part to which the adhesive was applied were overlapped.

In addition, the power supply terminal and the insulator, which are provided in a standing state, were inserted and fitted into the power supply terminal receiving hole drilled through the cooling base part.

Next, the electrostatic chuck part was pressed against the cooling base part at a pressure of 35 kg, maintained at 50° for five hours, and thereafter heated at 110° for twelve hours to bond and integrate the electrostatic chuck part and the cooling base part with each other.

Next, a surface protection tape is stuck on a side surface and a back surface of a laminate including the electrostatic chuck part, an adhesive layer, and the cooling base part, so that the side surface and the back surface of the laminate were masked. Therefore, only the mounting surface of the mounting plate was exposed.

Next, the mounting surface of the mounting plate of the electrostatic chuck part was subjected to grinding processing and polishing processing. Specifically, the cross-sectional shape of the mounting plate in a thickness direction was formed in a curved shape that curves in such a manner that a height with reference to a position of a main surface of the cooling base part was gradually increased from a center of a concave surface (the center of the mounting surface) toward an outer periphery of the concave surface (corresponding to an outer periphery of the mounting surface).

Next, a surface of the mounting plate is polished to be a smooth surface, and then the surface is blasted to form an annular projection portion having a width of 5 mm and a height of 30 μm on a peripheral portion of the surface. In addition, a plurality of columnar projection portions each having a diameter of 500 μm and a height of 30 μm were formed in a region of the surface surrounded by the annular projection portion. Therefore, a region of the surface excavated by blasting processing, that is, a region excluding the annular projection portion and the plurality of projection portions became a flow channel of a sealing medium.

Next, the surface protection tape is removed from the laminate including the electrostatic chuck part, the adhesive layer, and the cooling base part.

Next, particles remaining on the concave surface of the electrostatic chuck part and the mounting surface of the mounting plate were removed by ultrasonic cleaning in ultrapure water. Furthermore, the adhesive remaining on the side surface and the back surface of the laminate was removed by wiping with alcohol. Thereafter, drying was performed by a drier to obtain the electrostatic chuck device of Example 1.

Example 2

Preparation of Electrostatic Chuck Device

An electrostatic chuck device of Example 2 was obtained in the same manner as in Example 1 except that grinding processing and polishing processing are applied to the mounting surface of the mounting plate of the electrostatic chuck part, and a cross-sectional shape of the mounting plate in the thickness direction forms a curved shape formed to be bent in such a manner that a surface height with reference to a position of a main surface of the cooling base part is gradually decreased from a center of a convex surface (a center of the mounting surface) toward an outer periphery of the convex surface (corresponding to an outer periphery of the mounting surface).

Comparative Example 1

Preparation of Electrostatic Chuck Device

According to a known method, an electrostatic chuck part having a thickness of 10 μm of an internal electrostatic attraction electrode embedded therein was prepared.

A mounting plate of the electrostatic chuck part was an aluminum oxide-silicon carbide composite sintered compact containing 8.5% by mass of silicon carbide, and was a disk having a diameter of 450 mm and a thickness of 4.0 mm.

The support plate was also an aluminum oxide-silicon carbide composite sintered compact containing 8.5% by mass of silicon carbide, as in the case of the mounting plate, and was a disk having a diameter of 450 mm and a thickness of 4.0 mm.

Next, the mounting plate and the support plate were bonded and integrated so that the internal electrostatic attraction electrode was formed therebetween, thereby preparing the electrostatic chuck part. Thereafter, polishing processing was performed on the entire thickness of the electrostatic chuck part to be 1.0 mm, and on a surface of the mounting plate to be a flat surface.

Next, the mounting surface of the mounting plate of the electrostatic chuck part was subjected to grinding processing and polishing processing. The cross-sectional shape of the mounting plate in a thickness direction was formed to have a curved shape formed to be bent in such a manner that a height with reference to a main surface of a cooling base part was gradually increased from a center of a concave surface (the center of the mounting surface) toward an outer periphery of the concave surface (corresponding to an outer periphery of the mounting surface).

Next, a surface of the mounting plate is polished to be a smooth surface, and then the surface is blasted to form an annular projection portion having a width of 5 mm and a height of 30 μm on a peripheral portion of the surface. A plurality of columnar projection portions each having a diameter of 500 μm and a height of 30 μm were formed in a region of the surface surrounded by the annular projection portion. Therefore, a region of the surface excavated by blasting processing, that is, a region excluding the annular projection portion and the plurality of projection portions became a flow channel of a sealing medium.

On the other hand, an aluminum cooling base part having a diameter of 400 mm and a height of 30 mm was prepared by machining processing. A flow channel for circulating a refrigerant was formed inside the cooling base part.

In addition, separately, a plurality of first prismatic spacers each having a width of 2.0 μm, a length of 2.0 μm, and a height of 50 μm, a plurality of second prismatic spacers each having a width of 2.0 μm, a length of 2.0 μm, and a height of 75 μm, a plurality of third prismatic spacers each having a width of 2.0 μm, a length of 2.0 μm, and a height of 100 μm were formed by an aluminum oxide sintered compact.

Next, the spacers were fixed to the cooling base part. Specifically, on a bonding surface of the cooling base part with the electrostatic chuck part, the plurality of first prismatic spacers each were fixed at equal intervals to a circular position having a diameter of 75 mm centered on a center point of the bonding surface, the plurality of second prismatic spacers each were fixed at equal intervals to a circular position having a diameter of 150 mm centered on the center point of the bonding surface, and the plurality of third prismatic spacers each were fixed at equal intervals to a circular position having a diameter of 290 mm centered on the center point of the bonding surface.

Next, a silicone resin-based adhesive of an organic adhesive was applied to the bonding surface of the cooling base part to which the first to third spacers were fixed. Thereafter, the support plate of the electrostatic chuck part was brought into close contact with the silicone resin-based adhesive.

Next, the support plate of the electrostatic chuck part was approached to upper surfaces of the first to third spacers, and the entire electrostatic chuck part is deformed in an arcuate cross-sectional shape by pressing the electrostatic chuck part against the cooling base part at a pressure of 60 kg. In this manner, an upper end surface of the annular projection portion of the electrostatic chuck part and an upper end surface of each of the plurality of projection portions were positioned on the concave surface having a radius of curvature R of 75000 mm to obtain the electrostatic chuck device of Comparative Example 1.

Comparative Example 2

Preparation of Electrostatic Chuck Device

The mounting surface of the mounting plate of the electrostatic chuck part was subjected to grinding processing and polishing processing. Similar to the first embodiment, the cross-sectional shape of the mounting plate in the thickness direction was formed in a curved shape that curves in such a manner that a height with reference to a main surface of the cooling base part was gradually increased from the center of the concave surface (the center of the mounting surface) toward the outer periphery of the concave surface (corresponding to the outer periphery of the mounting surface). A difference from Example 1 is that a height difference between the center of the concave surface and the outer periphery of the concave surface became larger than in Example 1. Except for this difference, the electrostatic chuck device of Comparative Example 2 was obtained in the same manner as in Example 1.

Evaluation

In the electrostatic chuck devices of Examples 1 and 2, and Comparative Examples 1 and 2, (1) measurement of surface profile of mounting surface of electrostatic chuck part (evaluation of presence or absence of inflection point on mounting surface of the electrostatic chuck part), (2) measurement of flatness, (3) measurement of surface roughness (Ra), and (4) in-plane temperature characteristics of silicon wafer were evaluated respectively.

(1) Measurement of Surface Profile of Mounting Surface of the Mounting Plate of Electrostatic Chuck Part (Evaluation of Presence or Absence of Inflection Point on Mounting Surface of Electrostatic Chuck Part)

Figure 4:
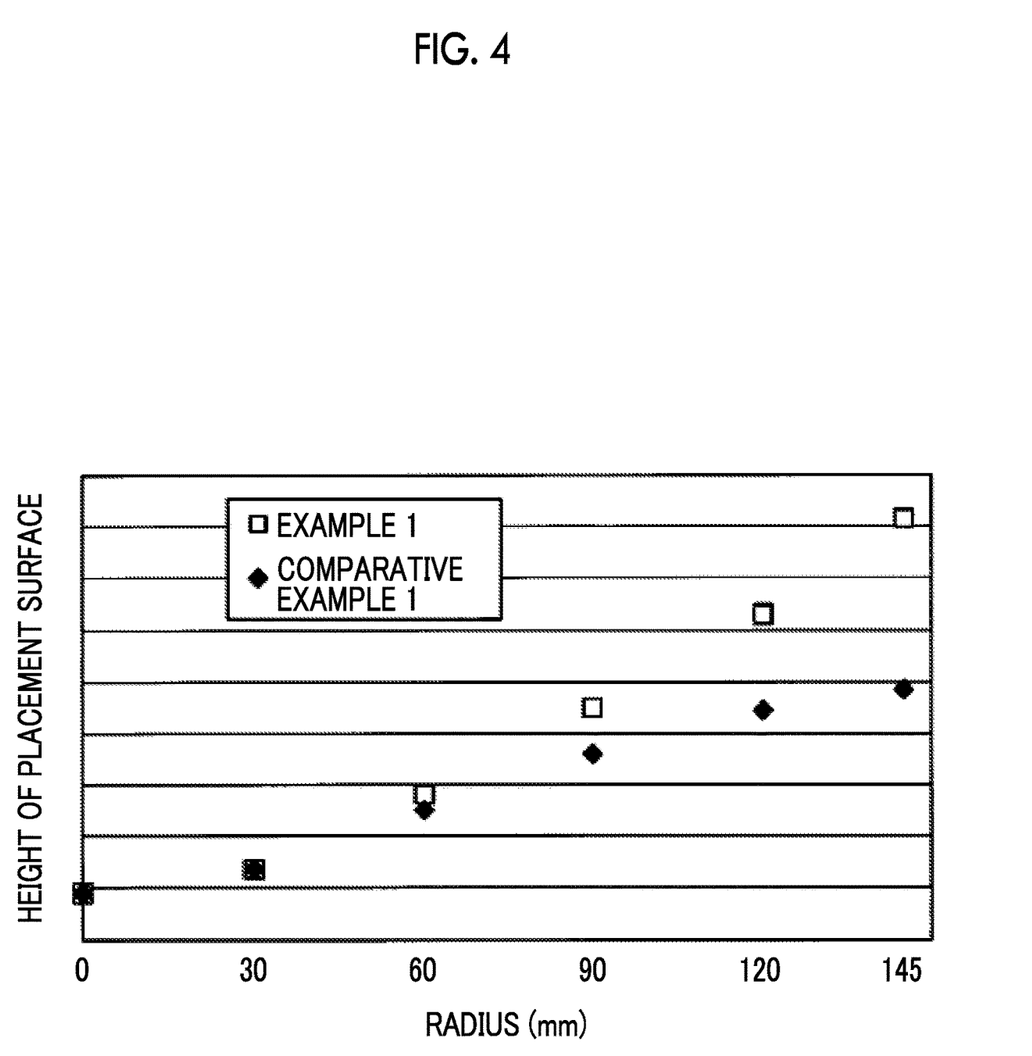
FIG. 4 is a graph showing measurement results of heights of a mounting surface of a mounting plate of an electrostatic chuck part in Example 1 and a mounting surface of a mounting plate of an electrostatic chuck part in Comparative Example 1 at each radius position.

A surface profile of the mounting surface of the electrostatic chuck part is measured with a three-dimensional measuring machine (trade name: RVA800A, manufactured by TOKYO SEIMITSU CO., LTD.). Measurement points are set to a center of the mounting surface (a radius position (1)), eight points at 45° intervals (eight orientations of 0°, 45°, 90°, 135°, 180°, 225°, 270°, and 315°) on a concentric circumference having a radius of 30 mm (a radius position (2)), eight points at 45° intervals on a concentric circumference having a radius of 60 mm (a radius position (3)), eight points at 45° intervals on a concentric circumference having a radius of 90 mm (a radius position (4)), eight points at 45° intervals on a concentric circumference having a radius of 120 mm (a radius position (5)), and eight points at 45° intervals on a concentric circumference having a radius of 145 mm (a radius position (6)). 41 points were measured. The surface profile was obtained from the measurement points. In addition, a difference between heights of two points on adjacent concentric circles in the same orientation among the above eight orientations was calculated. Specifically, for example, at 180°, a difference between heights of the point of the concentric circle having a radius of 30 mm and the point of the concentric circle having a radius of 60 mm (the height of the point of the concentric circle having a large radius (for example, the height of the point of the concentric circle having a radius of 60 mm)–the height of the point of the concentric circle having a small radius (for example, the height of the point of the concentric circle having a radius of 30 mm)) was calculated. In addition, separately, in 180° orientation, measurement for a height and calculation for a height difference are performed on a point on a concentric circle (a radius of 60 mm) outside the adjacent concentric circles and a point on an other concentric circle (a radius of 90 mm) immediately outside the concentric circle. Similar evaluations were performed on other adjacent points. Presence or absence of a point where a sign of the obtained calculation value is inverted as compared with a previous value (an inflection point) was evaluated. The results are shown in Table 1. In addition, the results of measuring the height at each of the radius positions (1), (2), (3), (4), (5), (6) on the mounting surface of the mounting plate of the electrostatic chuck part in Example 1 and the mounting surface of the mounting plate of the electrostatic chuck part in Comparative Example 1 are shown in FIG. 4. Furthermore, regarding the mounting surface of the mounting plate of the electrostatic chuck part in Example 1 and the mounting surface of the mounting plate of the electrostatic chuck part in Comparative Example 1, the results of calculating the difference between heights of two points on adjacent concentric circles in the same orientation among the above eight orientations (for example, the difference between heights of the radius position (1) and the radius position (2)) are shown in Table 2. In Table 2, the difference indicates a difference between the heights of two points. In Table 2, the difference" indicates a difference between two "height differences". For example, a value obtained by subtracting the difference between the height at the position (1) and the height at the position (2) from the difference between the height at the position (2) and the height at the position (3) is indicated. The unit of the value shown in Table 2 is mm. The measurement results at 180° for Example 1 and the measurement results at 0° for Comparative Example 1 are shown in Table 2, but the same results were obtained in any orientation with respect to the presence or absence of the inflection point. That is, there was no inflection point in any orientation in Example 1, and there was an inflection point in any orientation in Comparative Example 1.

(2) Measurement of Flatness

The flatness was measured according to JIS B 6191 using three dimensional measuring device (trade name: RVA800A, manufactured by TOKYO SEIMITSU CO., LTD). In this measurement, first, a total of 16 points in eight points each at 45° intervals on a concentric circumference were measured with respect to the three-dimensional coordinates of upper surfaces (holding surfaces) on an inner side and an outer side in a width direction of a groove. Next, a least-squares plane where the sum of squares from each measurement point is minimized was obtained by a least-squares method using the measurement values. The sum of the absolute values of lengths of the farthest point on an upper side and the farthest point on a lower side of the least-squares plane was adopted. The results are shown in Table 1.

(3) Measurement of Surface Roughness (Center Line Average Surface Roughness Ra)

The surface roughness of the mounting surface of the electrostatic chuck device of the present embodiment was measured using a surface roughness shape measuring machine (trade name: SURFCOM 1500SD3, manufactured by TOKYO SEIMITSU CO., LTD) in accordance with JIS B 0601. In this measurement, a total of six points in three points each at 120° intervals on a concentric circumference are measured on the surface roughness of the mounting surface, and an average value is adopted. The results are shown in Table 1.

(4) In-plane Temperature Characteristics of Silicon Wafer

A silicon wafer having a diameter of 300 mm was electrostatically attracted on the mounting surface of the electrostatic chuck part, and while cooling water at 30° C. was circulated through the flow channel of the cooling base part, in-plane temperature distribution of the silicon wafer at this time was measured by using thermography TVS-200EX (manufactured by Nippon Avionics Co., Ltd.).

The results are shown in Table 1.

TABLE 1

|  | surface profile of mounting surface | Presence or absence of inflection point | Flatness μm | Surface roughness (Ra) [nm] | In-plane temperature characteristics |
|---|---|---|---|---|---|
| Example 1 | Concave surface | Absence | 14 | 5 | ±3.0° C. |
| Example 2 | Convex surface | Absence | 14 | 5 | ±3.0° C. |
| Comparative Example 1 | Concave surface | Presence | 12 | 50 | ±3.5° C. |
| Comparative Example 2 | Concave surface | Absence | 40 | 5 | ±3.5° C. |

TABLE 2

|  | Example 1 | | | Comparative Example 1 | | |
|---|---|---|---|---|---|---|
| Radius position | Height 180° | Difference ' | Difference " | Height 0° | Difference ' | Difference " |
| (1) | 0 | — | | 0 | — | |
| (2) | 0.0009 | 0.0009 | | 0.0009 | 0.0009 | |
| (3) | 0.0029 | 0.002 | | 0.0023 | 0.0014 | |
| (4) | 0.0034 | 0.0005 | | 0.0022 | −0.0001 | |
| (5) | 0.0036 | 0.0002 | | 0.0017 | −0.0005 | |
| (6) | 0.0037 | 0.0001 | | 0.0008 | −0.0009 | |

From the results of Table 1 and Table 2, it was found that the electrostatic chuck devices of Example 1 and Example 2 were well controlled in a range in which the in-plane temperature of the silicon wafer was within ±3.0° C. In Examples 1 and 2, the mounting surface of the mounting plate includes the concave surface or the convex surface, there is no inflection point on the mounting surface, the flatness of the mounting surface is 14 μm, and the surface roughness of the mounting surface (Ra) is 5 nm.

On the other hand, in a case of the electrostatic chuck device of Comparative Example 1 in which the mounting surface of the mounting plate formed the concave surface and the flatness of the mounting surface is 12 μm, but there was an inflection point on the mounting surface and the surface roughness (Ra) of the mounting surface was 50 nm, the in-plane temperature of the silicon wafer was within the range of ±3.5° C. As a result, it was found that the control of the in-plane temperature of the silicon wafer was inferior to those of the electrostatic chuck devices of Example 1 and Example 2.

In addition, in a case of the electrostatic chuck device of Comparative Example 2 in which the mounting surface of the mounting plate formed the concave surface, there was no inflection point on the mounting surface, and the surface roughness (Ra) of the mounting surface was 5 nm, but the flatness of the mounting surface was 40 μm, the in-plane temperature of the silicon wafer was within the range of ±3.5° C. As a result, it was found that the control of the in-plane temperature of the silicon wafer was inferior to those of the electrostatic chuck devices of Example 1 and Example 2.

INDUSTRIAL APPLICABILITY

Provided are an electrostatic chuck device capable of making a surface temperature of a plate-like sample uniform and a method of manufacturing the same.

REFERENCE SIGNS LIST 1, 100: electrostatic chuck device
2: electrostatic chuck part
3: cooling base part
3a: a main surface of cooling base part
4: adhesive layer
11: mounting plate (base material)
11a: surface (mounting surface)
11b: center of mounting surface
11c: outer periphery of mounting surface
12: support plate
13: internal electrostatic attraction electrode
14: insulating material layer
15: power supply terminal
16: insulator
21: annular projection portion
21a: upper end
22: projection portion
22a: upper end
23: concave surface
23a: center of concave surface
23b: outer periphery of concave surface
31: flow channel
101: convex surface
101a: center of convex surface
101b: outer periphery of convex surface
h1: height from mounting surface to upper end of annular projection portion
h2: height from mounting surface to upper end of plurality of projection portions
W: plate-like sample

The invention claimed is:

1. An electrostatic chuck device comprising:
   an electrostatic chuck part which includes
      a base material having a mounting surface on which a plate-like sample is mounted, and
      an internal electrostatic attraction electrode which electrostatically attracts the plate-like sample to the mounting surface;
   a cooling base part which is configured to cool the electrostatic chuck part; and an adhesive layer which is interposed between the electrostatic chuck part and the cooling base part, wherein the mounting surface of the base material has a concave surface or a convex surface, the concave surface or the convex surface is a curved surface which gradually curves from a center of the mounting surface toward an outer periphery of the mounting surface and does not have an inflection point, and the base material has a cross-section in a thickness direction in which an absolute value of a difference between a height of a center of the concave surface or the convex surface and a height of an outer periphery of the concave surface or the convex surface is 1 µm or higher and 30 µm or lower, wherein the height of the center of the concave surface or the convex surface is obtained based on a position where a main surface of the cooling base part is located, and the height of the outer periphery of the concave surface or the convex surface is obtained based on the position where the main surface of the cooling base part is located.

2. The electrostatic chuck device according to claim 1, wherein a surface roughness of the mounting surface is lower than 40 nm.

3. A method of manufacturing an electrostatic chuck device comprising:

a bonding step of bonding, through an adhesive,
  an electrostatic chuck part which includes a base material having a mounting surface on which a plate-like sample is mounted and an internal electrostatic attraction electrode which electrostatically attracts the plate-like sample to the mounting surface and
  a cooling base part which is configured to cool the electrostatic chuck part; and a processing step of processing the mounting surface of the base material of the electrostatic chuck part, which is bonded to the cooling base part, to provide a concave surface or a convex surface, which is a curved surface which gradually curves from a center of the mounting surface toward an outer periphery of the mounting surface and does not have an inflection point.

4. The electrostatic chuck device according to claim 1, wherein the mounting surface is the concave surface.

5. The electrostatic chuck device according to claim 1, wherein the mounting surface is the convex surface.

6. The electrostatic chuck device according to claim 1, wherein the concave surface or the convex surface has the same area as the mounting surface in a plan view, and the other surface of the base material having the mounting surface, which is opposite to the mounting surface, is flat.

7. The electrostatic chuck device according to claim 1, wherein a surface profile of the mounting surface is obtained by
  measuring heights at a measurement point, which is located on a center of the mounting surface, and at a plurality of measurement points, which are located on a plurality of concentric circles having different radiuses and on a straight line passing through the center of the mounting surface;
  obtaining height differences between the measurement points, which are adjacent to each other and located on adjacent concentric circles, respectively based on values of the measured heights; and
  confirming a plurality of values of the height differences; and wherein when the surface profile shows that signs of the values of the height differences are not identical and there is a point where the signs are changed from plus sign to minus sign or from minus sing to plus sign, it is determined that the inflection point is included.

8. The electrostatic chuck device according to claim 1, wherein the base material and a support plate are formed of ceramics, and the ceramics are selected from the group consisting of an aluminum oxide-silicon carbide composite sintered compact, an aluminum oxide sintered compact, an aluminum nitride sintered compact, and an yttrium oxide sintered compact, and have a particle diameter of 2 µm or lower.

9. The method of manufacturing an electrostatic chuck device according to claim 3, wherein the processing step is a step of processing the mounting surface into the concave surface.

10. The method of manufacturing an electrostatic chuck device according to claim 3, wherein the processing step is a step of processing the mounting surface into the convex surface.

11. The method of manufacturing an electrostatic chuck device according to claim 3, wherein the concave surface or the convex surface is formed by grinding processing and polishing processing.

* * * * *